United States Patent
Zeman et al.

(10) Patent No.: US 7,439,516 B2
(45) Date of Patent: Oct. 21, 2008

(54) MODULE ASSEMBLY FOR MULTIPLE DIE BACK-ILLUMINATED DIODE

(75) Inventors: Gregory Scott Zeman, Waukesha, WI (US); Baiju Zacharia Babu, Milwaukee, WI (US); Mahesh Raman Narayanaswamy, Milwaukee, WI (US); David Michael Hoffman, New Berlin, WI (US); Brian Joseph Graves, Waukesha, WI (US)

(73) Assignee: General Electric Company, Schenectady, NY (US)

( * ) Notice: Subject to any disclaimer, the term of this patent is extended or adjusted under 35 U.S.C. 154(b) by 267 days.

(21) Appl. No.: 10/957,008

(22) Filed: Oct. 1, 2004

(65) Prior Publication Data

US 2006/0071173 A1     Apr. 6, 2006

(51) Int. Cl.
*H01L 31/00* (2006.01)
(52) U.S. Cl. ................................. 250/370.11
(58) Field of Classification Search ............. 250/370.11
See application file for complete search history.

(56) References Cited

U.S. PATENT DOCUMENTS

| | | | |
|---|---|---|---|
| 5,284,796 A * | 2/1994 | Nakanishi et al. ......... 438/108 |
| 6,292,529 B1 * | 9/2001 | Marcovici et al. ........... 378/19 |
| 6,392,217 B1 * | 5/2002 | Teranuma et al. ......... 250/208.1 |
| 6,426,991 B1 | 7/2002 | Mattson et al. |
| 6,461,881 B1 * | 10/2002 | Farnworth et al. ........... 438/15 |
| 6,603,209 B1 | 8/2003 | DiStefano et al. |
| 6,707,046 B2 | 3/2004 | Possin et al. |
| 6,762,473 B1 | 7/2004 | Goushcha et al. |
| 6,862,184 B2 | 3/2005 | Shi et al. |
| 6,879,032 B2 | 4/2005 | Rosenau et al. |
| 2002/0085665 A1 * | 7/2002 | Hoffman et al. ............ 378/19 |
| 2002/0092162 A1 * | 7/2002 | Tasi et al. .................. 29/840 |
| 2003/0122083 A1 | 7/2003 | Possin et al. |

FOREIGN PATENT DOCUMENTS

WO     02054955 A2     7/2002

OTHER PUBLICATIONS

New Photodiode Array Products for Computer Tomography Detectors, Detection Technology, Winter 2000-2001.
S.E. Holland, N. Wang and W.W. Moses, Development of Low Noise, Back-Side Illuminated Silicon Photodiode Arrays, IEEE Transactions on Nuclear Science, vol. 44, #3, Jun. 1997, pp. 443-447.
T.Kwa, P. Sarro and R. Wolffenbuttel, Backside-Illuminated Silicon Photodiode Array for an Integrated Spectrometer, IEEE Transactions on Electron Device vol. 44, #5, May 1997, pp. 761-765
Foreign Official Action/Search Report; Cited References for Netherlands Office Action, dated Jun. 29, 2006, NL Application No. 1030140, 7 pages, including translation.
Life Science Outsourcing, Inc., "Medical Device Link" MDDI's Medical Electronics Manufacturing; Copyright 2000; 5 pages.

* cited by examiner

Primary Examiner—David P Porta
Assistant Examiner—Shun Lee
(74) Attorney, Agent, or Firm—Armstrong Teasdale LLP (57) ABSTRACT

A computerized tomography imaging scanner module includes a plurality of scintillators, a plurality of back-illuminated photodiodes optically coupled with the scintillators, a multi-layer substrate having a plurality of substrate electrical conductors to which the photodiodes are electrically coupled, wherein each of the plurality of substrate conductors is connected to a different one of the back-illuminated photodiodes, and a flexible cable having a plurality of flex electrical conductors to which the substrate is electrically coupled, wherein each of the plurality of flex electrical conductors is connected to a different output of the multi-layer substrate.

22 Claims, 5 Drawing Sheets

MODULE ASSEMBLY FOR MULTIPLE DIE BACK-ILLUMINATED DIODE

BACKGROUND OF THE INVENTION

This invention relates generally to medical imaging systems, and more particularly to computed tomography (CT). Although the application subject matter finds particular use in x-ray systems, the invention may also find use in connection with other imaging modalities.

Modern CT scanners typically employ thousands of x-ray detectors to convert x-ray energy to electrical signals. A typical detector may include an array of scintillators attached to an array of semiconductor photodiodes which detect light or other ionizing radiation on their front surface. Some implementations have configurable detectors wherein signal currents from multiple individual photodiodes can be combined for further processing in a single amplifier channel. This arrangement permits the detection area for an individual pixel to be varied, using externally controlled electrical switches (field effect transistors, or FETs). The bond pads, for electrical connection to the FETs, are typically located at one or both ends of the photodiode, and the entire pixel array must be channeled from the center of the array toward one or both edges near the FETs.

As the number of elements in arrays increases, the density of the traces and bond pads increases to an unattractively high level near the edge of the photodiode array. This places some physical limits on the number and size of traces and bond pads that can be made using top surface contacts. With available wire bonding and silicon processing technology, no more than 40-50 slices of 0.625 mm pixels (measured at iso-center of a CT gantry) can be achieved.

Herein described are methods and apparatus which at least partially overcome the above-referenced problems.

BRIEF DESCRIPTION OF THE INVENTION

In one aspect, a computed tomography imaging scanner module is provided which includes a plurality of scintillators, a plurality of back-illuminated photodiodes optically coupled with the scintillators, a multi-layer substrate having a plurality of substrate electrical conductors to which the photodiodes are electrically coupled, wherein each of the plurality of substrate conductors is connected to a different one of the back-illuminated photodiodes, and a flexible cable having a plurality of flex electrical conductors to which the substrate is electrically coupled, wherein each of the plurality of flex electrical conductors is connected to a different output of the multi-layer substrate.

In another aspect, an imaging system is provided including an x-ray source and an x-ray detector module positioned to receive x-rays emitted from the source. The detector module includes a plurality of scintillators facing the x-ray source, a plurality of back-illuminated photodiodes optically coupled with the scintillators, a multi-layer substrate electrically coupled with the plurality of back-illuminated photodiodes, and a flexible cable electrically coupled with the multi-layer substrate.

In yet another aspect, a method is provided. The method includes receiving photons from a scintillator, converting the photons to an electrical signal, transmitting the electrical signal through a multi-layer substrate, and transmitting the electrical signal through a multi-layer flexible circuit.

In still another aspect, a method for attaching a back-illuminated diode to a multi-layer substrate is provided, the method includes wirebonding a stud bump to a surface of the back-illuminated diode, placing adhesive onto a surface of the multi-layer substrate, aligning the surface with the stud bump relative to the surface with the adhesive on the multi-layer substrate, heating the back-illuminated diode and the substrate to an adhesive cure temperature, and underfilling a gap formed between the back-illuminated diode and the substrate.

In another aspect, a method for attaching a flexible electric circuit to a substrate is provided. The method includes placing a solder bump onto a surface of the multi-layer substrate, placing reflow encapsulant onto a surface of the flexible electric circuit, aligning the surface of the multi-layer substrate with the surface with the solder bump, heating the flexible electric circuit and the substrate to the solder reflow temperature.

DETAILED DESCRIPTION OF THE INVENTION

There are herein provided radiation detection methods and apparatus useful for imaging systems such as, for example, but not limited to a Computed Tomography (CT) System. The apparatus and methods are illustrated with reference to the figures wherein similar numbers indicate the same elements in all figures. Such figures are intended to be illustrative rather than limiting and are included herewith to facilitate explanation of an exemplary embodiment of the apparatus and methods of the invention.

In some known CT imaging system configurations, a radiation source projects a fan-shaped beam which is collimated to lie within an X-Y plane of a Cartesian coordinate system and generally referred to as an "imaging plane". The radiation beam passes through an object being imaged, such as a patient. The beam, after being attenuated by the object, impinges upon an array of radiation detectors. The intensity of the attenuated radiation beam received at the detector array is dependent upon the attenuation of a radiation beam by the object. Each detector element of the array produces a separate electrical signal that is a measurement of the beam attenuation at the detector location. The attenuation measurements from all the detectors are acquired separately to produce a transmission profile.

In third generation CT systems, the radiation source and the detector array are rotated with a gantry within the imaging plane and around the object to be imaged such that an angle at which the radiation beam intersects the object constantly changes. A group of radiation attenuation measurements, i.e., projection data, from the detector array at one gantry angle is referred to as a "view". A "scan" of the object includes a set of views made at different gantry angles, or view angles, during one revolution of the radiation source and detector.

In an axial scan, the projection data is processed to reconstruct an image that corresponds to a two dimensional slice taken through the object. One method for reconstructing an image from a set of projection data is referred to in the art as the filtered back projection technique. This process converts the attenuation measurements from a scan into integers called "CT numbers" or "Hounsfield units", which are used to control the brightness of a corresponding pixel on a display device.

To reduce the total scan time, a "helical" scan may be performed. To perform a "helical" scan, the patient is moved while the data for the prescribed number of slices is acquired. Such a system generates a single helix from a fan beam helical scan. The helix mapped out by the fan beam yields projection data from which images in each prescribed slice may be reconstructed.

As used herein, an element or step recited in the singular and proceeded with the word "a" or "an" should be understood as not excluding plural said elements or steps, unless such exclusion is explicitly recited. Furthermore, references to "one embodiment" of the present invention are not intended to be interpreted as excluding the existence of additional embodiments that also incorporate the recited features.

Also as used herein, the phrase "reconstructing an image" is not intended to exclude embodiments of the present invention in which data representing an image is generated but a viewable image is not. Therefore, as used herein the term, "image," broadly refers to both viewable images and data representing a viewable image. However, many embodiments generate (or are configured to generate) at least one viewable image.

Figure 1:
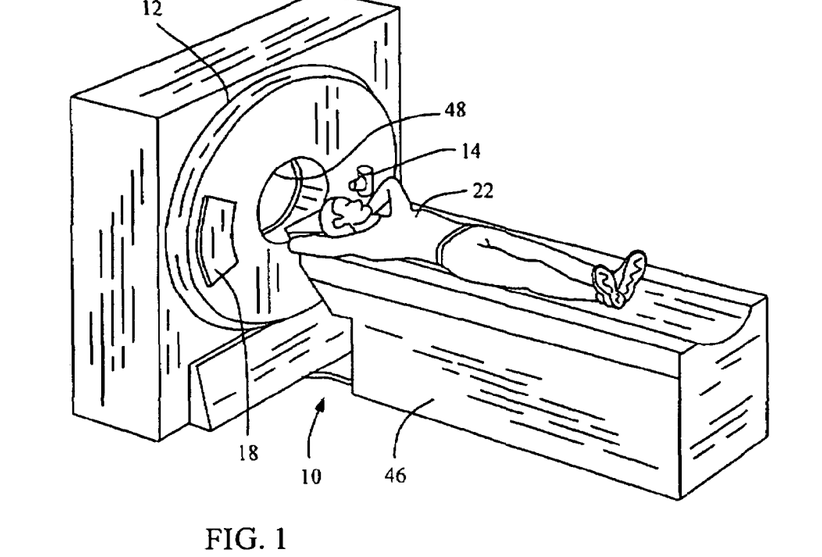
FIG. 1 is a pictorial view of a CT imaging system embodiment.
Figure 2:
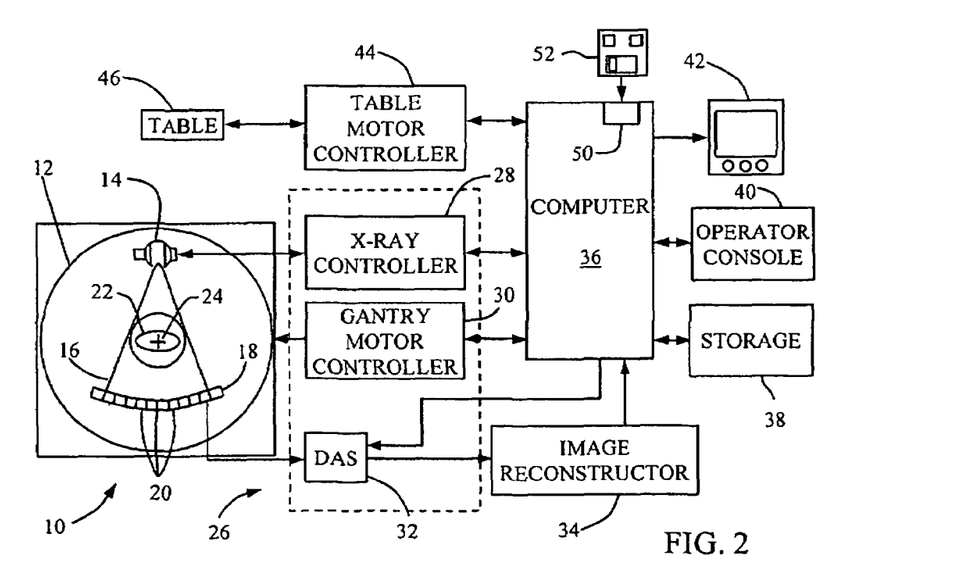
FIG. 2 is a block schematic diagram of the system illustrated in FIG. 1.

FIG. 1 is a pictorial view of a CT imaging system 10. FIG. 2 is a block schematic diagram of system 10 illustrated in FIG. 1. In the exemplary embodiment, a computed tomography (CT) imaging system 10, is shown as including a gantry 12 representative of a "third generation" CT imaging system. Gantry 12 has a radiation source 14 that projects a cone beam 16 of X-rays toward a detector array 18 on the opposite side of gantry 12.

Detector array 18 is formed by a plurality of detector rows (not shown in FIGS. 1 and 2) including a plurality of detector elements 20 which together sense the projected X-ray beams that pass through an object, such as a medical patient 22. Each detector element 20 produces an electrical signal that represents the intensity of an impinging radiation beam and hence the attenuation of the beam as it passes through object or patient 22. An imaging system 10 having a multislice detector 18 is capable of providing a plurality of images representative of a volume of object 22. Each image of the plurality of images corresponds to a separate "slice" of the volume. The "thickness" or aperture of the slice is dependent upon the thickness of the detector rows.

During a scan to acquire radiation projection data, gantry 12 and the components mounted thereon rotate about a center of rotation 24. FIG. 2 shows only a single row of detector elements 20 (i.e., a detector row). However, multislice detector array 18 includes a plurality of parallel detector rows of detector elements 20 such that projection data corresponding to a plurality of quasi-parallel or parallel slices can be acquired simultaneously during a scan.

Rotation of gantry 12 and the operation of radiation source 14 are governed by a control mechanism 26 of CT system 10. Control mechanism 26 includes a radiation controller 28 that provides power and timing signals to radiation source 14 and a gantry motor controller 30 that controls the rotational speed and position of gantry 12. A data acquisition system (DAS) 32 in control mechanism 26 samples analog data from detector elements 20 and converts the data to digital signals for subsequent processing. An image reconstructor 34 receives sampled and digitized radiation data from DAS 32 and performs high-speed image reconstruction. The reconstructed image is applied as an input to a computer 36 which stores the image in a mass storage device 38.

Computer 36 also receives commands and scanning parameters from an operator via a console 40 that has a keyboard. An associated cathode ray tube display 42 allows the operator to observe the reconstructed image and other data from computer 36. The operator supplied commands and parameters are used by computer 36 to provide control signals and information to DAS 32, radiation controller 28, and gantry motor controller 30. In addition, computer 36 operates a table motor controller 44 which controls a motorized table 46 to position patient 22 in gantry 12. Particularly, table 46 moves portions of patient 22 through gantry opening 48.

In one embodiment, computer 36 includes a device 50, for example, a floppy disk drive, CD-ROM drive, DVD drive, magnetic optical disk (MOD) device, or any other digital device including a network connecting device such as an Ethernet device for reading instructions and/or data from a computer-readable medium 52, such as a floppy disk, a CD-ROM, a DVD or an other digital source such as a network or the Internet, as well as yet to be developed digital means. In another embodiment, computer 36 executes instructions stored in firmware (not shown). Generally, a processor in at least one of DAS 32, reconstructor 34, and computer 36 shown in FIG. 2 is programmed to execute the processes described below. Of course, the method is not limited to practice in CT system 10 and can be utilized in connection with many other types and variations of imaging systems. In one embodiment, Computer 36 is programmed to perform functions described herein, accordingly, as used herein, the term computer is not limited to just those integrated circuits referred to in the art as computers, but broadly refers to computers, processors, microcontrollers, microcomputers, programmable logic controllers, application specific integrated circuits, and other programmable circuits. Although the herein described methods are described in a medical setting, it is contemplated that the benefits of the invention accrue to non-medical imaging systems such as those systems typically employed in an industrial setting or a transportation setting, such as, for example, but not limited to, a baggage scanning CT system for an airport or other transportation center.

Figures 3, 4:
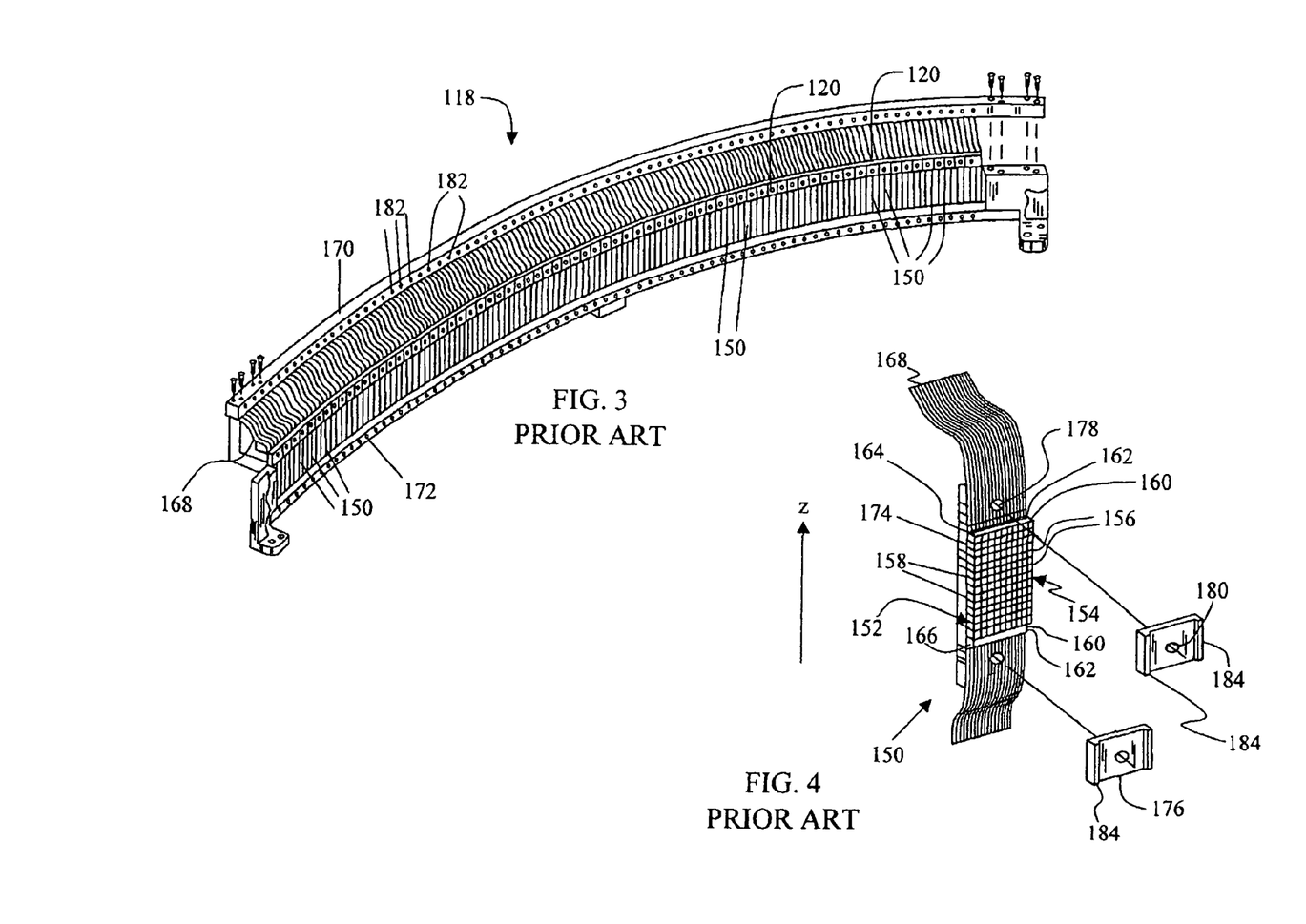
FIG. 3 illustrates a known array of detector modules.
FIG. 4 illustrates the known detector module shown in FIG. 3.

As shown in FIGS. 3 and 4, a known detector array 118 includes a plurality of detector module assemblies 150 (also referred to as detector modules), each module comprising an array of detector elements 120. Each detector module 150 includes a high-density photosensor array 152 and a multidimensional scintillator array 154 positioned above and adjacent to photosensor array 152. Particularly, scintillator array 154 includes a plurality of scintillators 156, while photosensor array 152 includes photodiodes 158, a switch apparatus 160, and a decoder 162. A material such as a titanium dioxide-filled epoxy fills the small spaces between scintillator elements. Photodiodes 158 are individual photodiodes or photodiodes 158 are a multidimensional diode array. Photodiodes 158 are diffused, deposited, or formed on a silicon substrate. Scintillator array 154, as known in the art, is positioned over or adjacent photodiodes 158. Photodiodes 158 are optically coupled to scintillator array 154 and have electrical output lines for transmitting signals representative of the light output by scintillator array 154. Each photodiode 158 produces a separate low level analog output signal that is a measurement of beam attenuation for a specific scintillator of scintillator array 154. Photodiode output lines (not shown in FIGS. 3 or 4) may, for example, be physically located on one side of module 150 or on a plurality of sides of module 150. As illustrated in FIG. 4, photodiode outputs are located at opposing sides of the photodiode array.

As shown in FIG. 3, detector array 118 includes fifty-seven detector modules 150. Each detector module 150 includes a photosensor array 152 and typically a matching scintillator array 154. As a result, array 118 is segmented into 16 rows and 912 columns (16×57 modules) allowing up to, for example, N=16 simultaneous slices of data to be collected, in the current art, along a z-axis with each rotation of gantry 12, where the z-axis is an axis of rotation of the gantry.

Switch apparatus 160 is a multidimensional semiconductor switch array. Switch apparatus 160 is coupled between photosensor array 152 and DAS 32. Switch apparatus 160, in one embodiment, includes two semiconductor switch arrays 164 and 166. Switch arrays 164 and 166 each includes a plurality of field effect transistors (FETs) (not shown) arranged as a multidimensional array. Each FET includes an input electrically connected to one of the respective photodiode output lines, an output, and a control (not shown). FET outputs and controls are connected to lines that are electrically connected to DAS 32 via a flexible electrical cable 168. Particularly, about one-half of the photodiode output lines are electrically connected to each FET input line of switch 164 with the other one-half of photodiode output lines electrically connected to FET input lines of switch 166. Flexible electrical cable 168 is thus electrically coupled to photosensor array 152, for example, by wire bonding from flex 168 to switch apparatus 160, and from switch apparatus 160 and decoder 162 to photodiode 158.

Decoder 162 controls the operation of switch apparatus 160 to enable, disable, or combine photodiode 158 outputs depending upon a desired number of slices and slice resolutions for each slice. Decoder 162, in one embodiment, is a FET controller as known in the art. Decoder 162 includes a plurality of output and control lines coupled to switch apparatus 160 and DAS 32. Particularly, the decoder outputs are electrically coupled to the switch apparatus control lines to enable switch apparatus 160 to transmit the proper data from the switch apparatus inputs to the switch apparatus outputs. Utilizing decoder 162, specific FETs within switch apparatus 160 are selectively enabled, disabled, or combined so that specific photodiode 158 outputs are electrically connected to CT system DAS 32. Decoder 162 enables switch apparatus 160 so that a selected number of rows of photosensor array 152 are connected to DAS 32, resulting in a selected number of slices of data being electrically connected to DAS 32 for processing.

As shown in FIGS. 3 and 4, detector modules 150 are fitted into detector array 118 and secured in place by rails 170 and 172. FIG. 3 shows rail 172 already secured in place, while rail 170 is about to be secured over electrical cable 168, over module 150 substrate 174, flexible cable 168, and mounting bracket 176. Screws (not shown in FIG. 3 or 4) are then threaded through holes 178 and 180 and into threaded holes 182 of rail 170 to secure modules 150 in place. Flanges 184 of mounting brackets 176 are held in place by compression against rails 170 and 172 (or by bonding, in one embodiment) and prevent detector modules 150 from "rocking." Mounting brackets 176 also clamp flexible cable 168 against substrate 174, or, in one embodiment, flexible cable 168 is also adhesively bonded to substrate 174.

Conventionally, however, traces or electrical paths can only be brought in from either end of the photodiode arrays, which places some physical limits on the number and size of traces and bond pads that can be made using top surface contacts. The physical limits on the number and size of traces and bond pads can be obviated by inverting the diode and placing the surface contacts on the back side of the photodiode array. The technology for this is described in, for example, U.S. Pat. No. 6,707,046 (i.e. a backside illuminated or "backlit" diode). Electrical connections are made directly from each pixel of the backlit diode array to a substrate made from ceramic, printed wiring board (PWB) or the like. The substrate is multi-layered to carry electrical signals from the photodiode array, through the multi-layer substrate, to the opposite side of the substrate. Electrically bondable pads are provided on each surface of the substrate facilitating electrical interconnection. The back-connected design relieves the requirement to bring traces to both edges of the diode array and enables unrestricted tiling of devices in the z and x dimension of a CT scanner.

Figure 5:
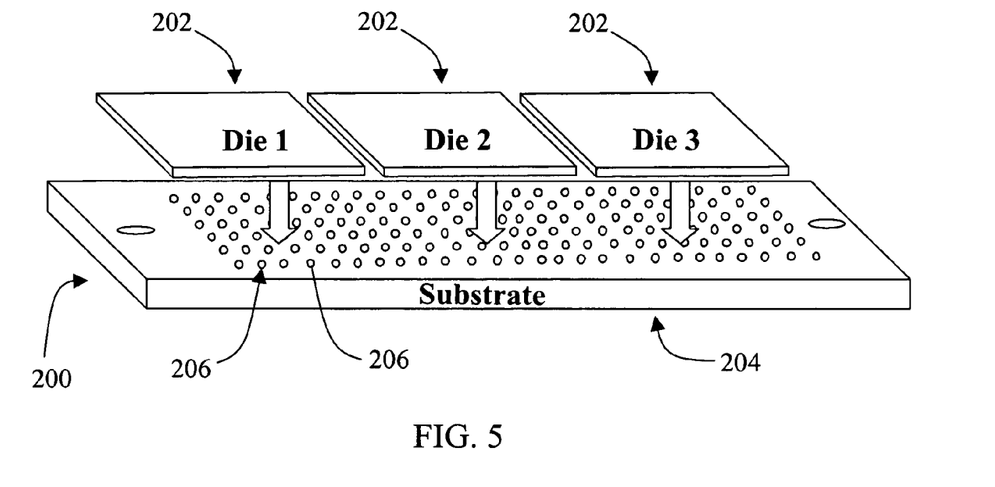
FIG. 5 illustrates placement of backlit diode arrays with the substrate.
Figure 6:
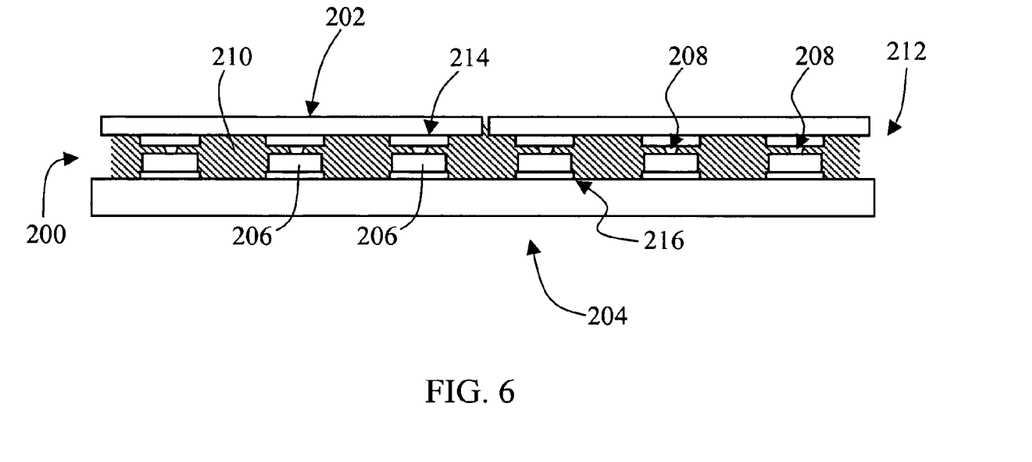
FIG. 6 illustrates the bond joint between substrate and backlit diode array.

FIGS. 5 and 6 illustrate a diode-substrate assembly 200 assembled by placing backlit diode arrays 202 onto multi-layer substrate 204. An array of conductive epoxy 206 is dabbed, screened, or dispensed onto substrate 204 prior to alignment and attachment of backlit diode array 202 to substrate 204. A plurality of stud bumps 208 are thermosonically bonded onto the patterned 214 metallized surface of the backlit diode array 202, placed substantially in the center of each of the pixels of the array 202. Stud bumps 208 are metallic and, in one embodiment, are gold. Electrically conductive adhesive 206 is patterned on the surface of substrate 204 with the same matching and opposing pattern 216 as the stud bump array 208. Pick and place flip chip technology is used to precision align diode array 202 with substrate 204 and pressed to bottom the stud bumps 208 to the pad of array 216. The conductive adhesive is cured as prescribed by the manufacturer for time and temperature requirements. Stud bumps 208 facilitate controlling uniform elevation of backlit diode array 202 and providing a gap 212 for underfill material 210. Stud bumps 208 contact the surface of substrate 204 throughout the array of the contact region and, being of substantially the same elevation, enable the diode array to conform to substantially the same surface flatness of the substrate 204. The stud bumps also form a gap 212 into which an underfill material 210 is wicked by capillary action. Underfill 210 serves to strengthen the joint between backlit diode array 202 and substrate 204. Underfill 210 also serves to prevent ionic and other contamination from entering the array attachment region, adding low signal robustness to the joints.

Figure 7:
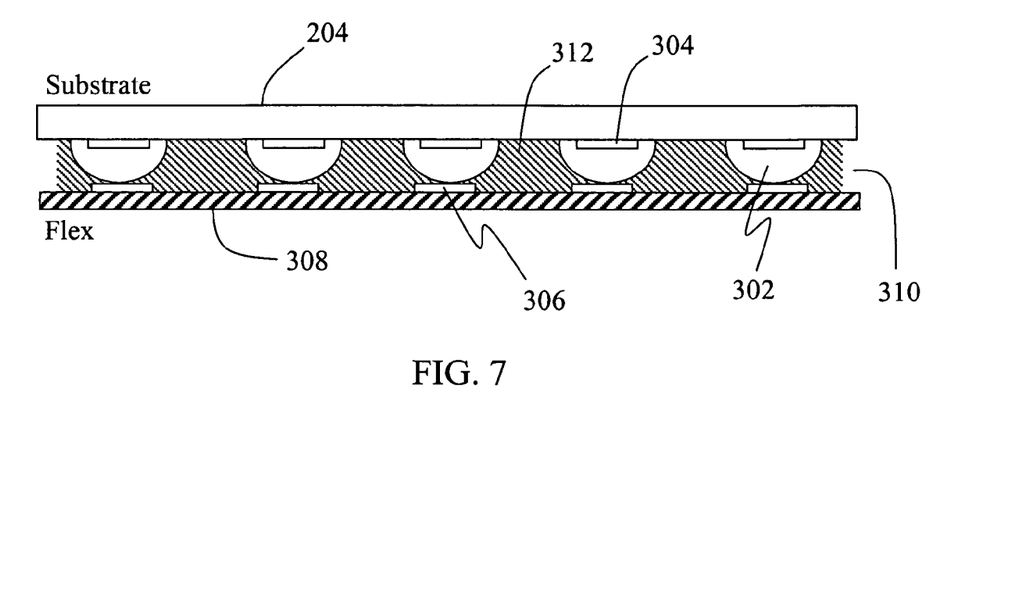
FIG. 7 illustrates the bond joint between substrate and flex circuit.

FIG. 7 illustrates a flex circuit 308 attached to the substrate 204 on the side opposite backlit diode array 202 (not shown). A plurality of eutectic solder balls 302 are positioned on substrate 204 in a pattern that follows a plurality of electrical output pads 304 of substrate 204. A no-flow process is then used to fill the gap 310 by first placing encapsulant 312 onto flex circuit 308 using pick and place equipment, joining flex circuit 308 to substrate 204, then flowing solder balls 302 by heating the assembly to the prescribed temperature required by the solder. Encapsulating material is cured as part of the solder flow heating. Flex circuit 308 correspondingly has a pattern of electrical contact pads 306 which match the opposing pattern 304 on substrate 204. The no-flow process refers to the placement of encapsulant on flex circuit 308 prior to joining the two surfaces, then heating to the solder melt temperature.

Figure 8:
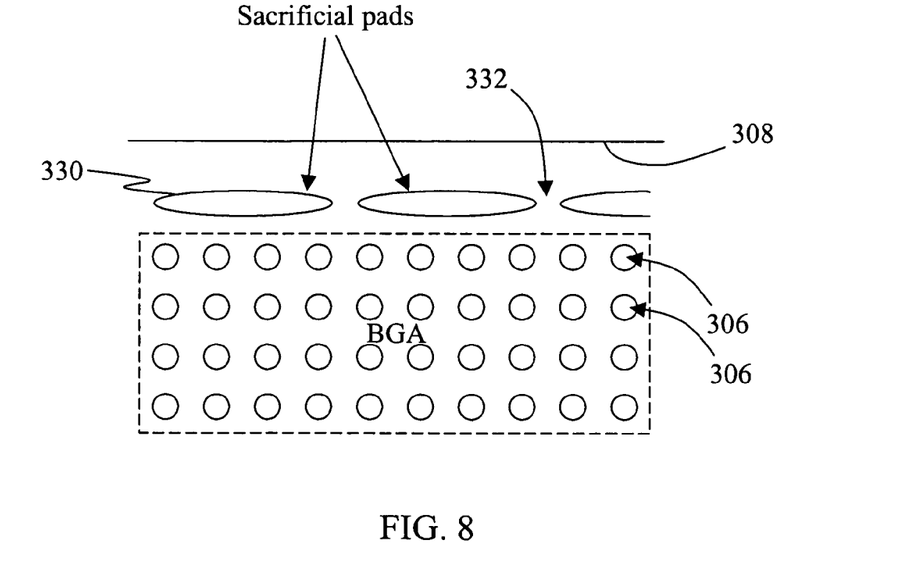
FIG. 8 illustrates a plan view of sacrificial pads on flex circuit.

FIG. 8 illustrates flex circuit 308, configured with array pattern 306, which is also configured with sacrificial pad 330 which is stitched with axial gaps 332 between the stitches.

Figure 9:
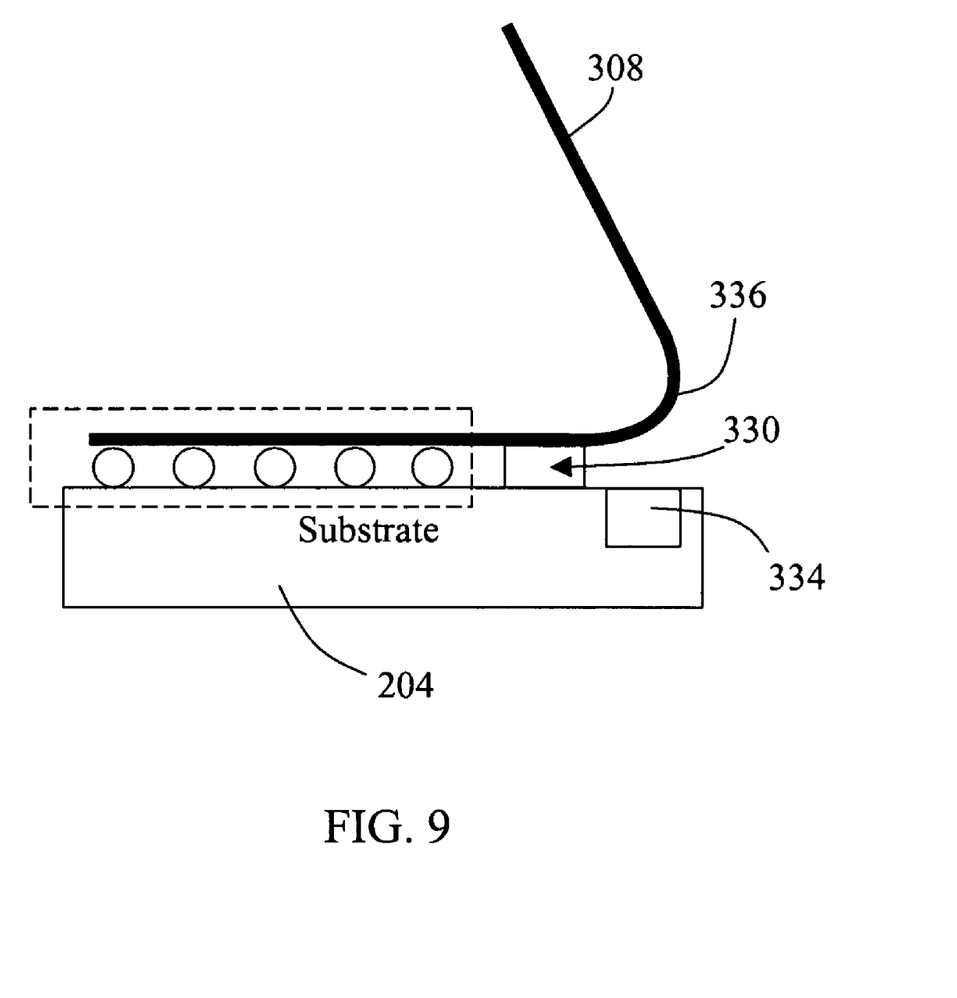
FIG. 9 illustrates a flex circuit attached to substrate, with bend line of flex defined by the location of sacrificial pads.

Similar metallized sacrificial stitches are positioned on the substrate (not shown) in similar fashion relative to the pattern of contact pads 304. When flex circuit 308 is joined with substrate 204 the opposing stitch patterns provide opposing metallized surfaces which provide at least three functions. FIG. 9 illustrates sacrificial pads 330, which when joined in the subsequent adhesion process, provide an enhanced adhesion surface for encapsulant to adhere to. Sacrificial pads 330 also serve to discourage flow of encapsulant 312 beyond sacrificial pads 330. Encapsulant 312 is limited in its flow area by groove a 334, positioned and sized such that capillary action will cease in the groove region 334. In so limiting the flow, sacrificial pads 330 also serve to define the bend line 336 of the flex circuit 308. Axial gaps 332 allow release of gases formed during the heating process of solder bumps 304.

One technical effect of the herein described methods and apparatus is that they provide a back-illuminated diode on a multi-layer substrate and a flex circuit attached to the underside of the substrate. Another technical effect is that herein described methods and apparatus use a multi-layer ceramic or printed wiring board as substrate material. Another technical effect is that herein described methods and apparatus use solder and reflow encapsulant for flex attachment and bend line control. Another technical effect is that herein described methods and apparatus use sacrificial pads for controlling underfill materials and for reliability enhancement of a CT detector module.

The invention has been described with reference to the preferred embodiment. Modifications and alterations will occur to others skilled in the art upon reading and understanding the preceding detailed description. It is intended that the invention be construed as including all such modifications and alterations insofar as they come within the scope of the appended claims or the equivalents thereof.

What is claimed is:

1. A computerized tomography imaging scanner module comprising:
   a plurality of scintillators;
   a plurality of back-illuminated photodiodes optically coupled with said scintillators;
   a multi-layer substrate comprising a first surface, a substantially parallel second surface opposing said first surface, and a groove defined within said second surface, said photodiodes are coupled to said first surface, said first surface having a plurality of substrate electrical conductors to which said photodiodes are electrically coupled, and each of said plurality of substrate conductors is connected to a different one of said back-illuminated photodiodes;
   a flexible electrical circuit coupled to said substrate second surface, said flexible electrical circuit having a plurality of flex electrical conductors to which said substrate second surface is electrically coupled, wherein each of said plurality of flex electrical conductors is connected to a different output of said substrate second surface; and
   a plurality of metallized sacrificial pads coupled between said substrate and said flexible electrical circuit adjacent to said groove within said substrate, wherein each of said plurality of metallized sacrificial pads is separated from an adjacent sacrificial pad by a gap.

2. A module in accordance with claim 1 wherein said plurality of scintillators comprises a two-dimensional array.

3. A module in accordance with claim 2 wherein said plurality of back-illuminated photodiodes comprises a two-dimensional array aligned with said plurality of array of scintillators.

4. A module in accordance with claim 3 wherein said plurality of substrate conductors comprises a two-dimensional array aligned with said array of back-illuminated photodiodes.

5. A module in accordance with claim 1 wherein each of said plurality of back-illuminated photodiodes comprises stud bumps.

6. A module in accordance with claim 5 wherein each of said stud bumps comprises gold.

7. A module in accordance with claim 5 wherein an elevation of each of said plurality of back-illuminated photodiodes is controlled by an elevation of said stud bumps.

8. A module in accordance with claim 1 wherein said multi-layer substrate electrically coupled to each of said plurality of back-illuminated photodiodes with electrically conductive epoxy.

9. A module in accordance with claim 1 wherein a separation is formed between each of said plurality of back-illuminated photodiodes and said substrate.

10. A module in accordance with claim 9 wherein said separation is filled with underfill.

11. A module in accordance with claim 1 wherein each of said flex electrical conductors are connected to a different output of said multi-layer substrate with reflowed eutectic solder to form electrical connections.

12. A module in accordance with claim 11 wherein a plurality of spatial regions between said electrical connections are filled with encapsulant.

13. A module in accordance with claim 12 wherein said encapsulant contacts a surface of said flexible electrical comprising said flex electrical conductors.

14. A module in accordance with claim 1 wherein said groove comprises an underfill break channel formed in said substrate.

15. A module in accordance with claim 14 wherein said plurality of metallized sacrificial pads is adjacent to said underfill break channel formed in said substrate.

16. A module in accordance with claim 1 wherein a surface of said flexible electrical circuit comprises at least one of said plurality of metallized sacrificial pads.

17. A module in accordance with claim 1 wherein said multi-layer substrate comprises at least one of said plurality of metallized sacrificial pads.

18. A module in accordance with claim 1 wherein a sacrificial pad coupled to said multi-layer substrate is positioned opposite a sacrificial pad coupled to said flexible electrical circuit when said flexible electrical circuit coupled to said multi-layer substrate.

19. A module in accordance with claim 1 wherein said multi-layer substrate is fabricated from ceramic.

20. A module in accordance with claim 1 wherein said multi-layer substrate is fabricated from printed wiring board.

21. An imaging system comprising:
   an x-ray source; and
   an x-ray detector module positioned to receive x-rays emitted from said source, said detector module comprising:
      a plurality of scintillators facing said x-ray source;
      a plurality of back-illuminated photodiodes optically coupled with said scintillators;
      a multi-layer substrate comprising a first surface, a substantially parallel second surface opposing said first surface, and a groove defined within said second surface, said photodiodes are coupled to said first surface, said first surface is electrically coupled with said plurality of back-illuminated photodiodes;
      a flexible circuit electrically coupled to said substrate second surface; and a plurality of metallized sacrificial pads coupled between said substrate and said flexible cable adjacent said groove within said substrate, wherein each of said plurality of metallized sacrificial pads is separated from an adjacent sacrificial pad by a gap.

22. A method comprising:

coupling a plurality of back-illuminated photodiodes to a first surface of a multi-layer substrate;

defining a groove within a second surface of the multi-layer substrate;

coupling a multi-layer flexible circuit to the second surface of the multi-layer substrate, the second surface is substantially parallel to and opposes the first surface;

coupling a plurality of metallized sacrificial pads between the multi-layer substrate and the multi-layer flexible circuit adjacent to the groove within the second surface, wherein each of the plurality of metallized sacrificial pads is separated from an adjacent sacrificial pad by a gap;

receiving, with at least one of the plurality of back-illuminated photodiodes, photons from a scintillator;

the plurality of back-illuminated photodiodes converting the photons to an electrical signal;

transmitting the electrical signal through the multi-layer substrate; and transmitting the electrical signal through the multi-layer flexible circuit.

* * * * *